US012598724B2

(12) United States Patent \
Sarkar et al.

(10) Patent No.: US 12,598,724 B2 \
(45) Date of Patent: Apr. 7, 2026

(54) THERMAL TRANSFER STRUCTURES FOR IMMERSION COOLING

(71) Applicant: Microsoft Technology Licensing, LLC, Redmond, WA (US)

(72) Inventors: Sreya Sarkar, Chicago, IL (US); Kathryn M. Oseen-Senda, Seattle, WA (US); Dennis Trieu, Calgary (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 287 days.

(21) Appl. No.: 18/086,000

(22) Filed: Dec. 21, 2022

(65) Prior Publication Data

US 2024/0215203 A1 Jun. 27, 2024

(51) Int. Cl.
*H05K 7/20* (2006.01)
*F28F 3/02* (2006.01)

(52) U.S. Cl.
CPC ......... *H05K 7/20509* (2013.01); *F28F 3/022* (2013.01); *H05K 7/203* (2013.01); *H05K 7/20381* (2013.01); *H05K 7/2039* (2013.01)

(58) Field of Classification Search
CPC ............... H05K 7/20509; H05K 7/203; H05K 7/20381; H05K 7/2039; H05K 7/20409; F28F 3/022
See application file for complete search history.

(56) References Cited

U.S. PATENT DOCUMENTS

| | | | |
|---|---|---|---|
| 5,781,411 A | 7/1998 | Feenstra et al. | |
| 7,521,789 B1* | 4/2009 | Rinehart ............. | H01L 23/3735 |
| | | | 257/713 |

| | | | |
|---|---|---|---|
| 2010/0328890 A1 | 12/2010 | Campbell et al. | |
| 2013/0112388 A1* | 5/2013 | Kwak ................... | H01L 23/473 |
| | | | 165/185 |
| 2015/0027669 A1* | 1/2015 | Kokas ..................... | F28D 9/005 |
| | | | 165/104.26 |
| 2016/0091257 A1* | 3/2016 | Minx ...................... | F28D 15/02 |
| | | | 165/104.21 |
| 2016/0334168 A1* | 11/2016 | Suzuki ................... | F28D 15/02 |
| 2017/0248379 A1* | 8/2017 | Kadijk ................... | F21V 29/81 |
| 2020/0323100 A1* | 10/2020 | Chiu ...................... | H05K 7/208 |

FOREIGN PATENT DOCUMENTS

| | | |
|---|---|---|
| EP | 3209965 A1 | 8/2017 |
| JP | H08316388 A | 11/1996 |

OTHER PUBLICATIONS

International Search Report and Written Opinion received for PCT Application No. PCT/US2023/036974, mailed on Feb. 12, 2024, 22 pages.
International Preliminary Report on Patentability (Chapter I) received for PCT Application No. PCT/US2023/036974, mailed on Jul. 3, 2025, 16 pages.

* cited by examiner

*Primary Examiner* — Jacob R Crum
(74) *Attorney, Agent, or Firm* — Ray Quinney & Nebeker P.C.; John O. Carpenter

(57) ABSTRACT

A thermal management device is described. The device includes a substrate having a spreader surface and a plurality of thermal features connected to the spreader surface of the substrate. At least one thermal feature includes a body having a longitudinal axis and a hollow bore having an inner diameter perpendicular to the longitudinal axis and an opening at a distal end distal from the substrate.

22 Claims, 11 Drawing Sheets

436

446   444

440

442

448

408

436                                    540

544

542

550      552

THERMAL TRANSFER STRUCTURES FOR IMMERSION COOLING

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management. Immersion cooling systems provide a high amount of cooling capacity by boiling a working fluid to absorb heat from the submerged electronic components of the computing devices.

BRIEF SUMMARY

In some embodiments, a thermal management device includes a substrate and a plurality of thermal features connected to a spreader surface of the substrate. At least one thermal feature of the plurality of thermal features includes a body having a longitudinal axis and a hollow bore in the body having inner diameter perpendicular to the longitudinal axis and an opening at a distal end distal from the substrate.

In some embodiments, a thermal management device includes a heat spreader and a plurality of thermal features connected to a spreader surface of the heat spreader. At least one thermal feature of the plurality of thermal features includes a body having a longitudinal axis that is perpendicular to the spreader surface of the heat spreader, a hollow bore in the body having inner diameter perpendicular to the longitudinal axis, and a cap positioned at a terminal end of the body with an opening therethrough to provide fluid communication with the hollow bore.

In some embodiments, a thermal management device includes a heat spreader and a plurality of thermal features connected to a spreader surface of the heat spreader. At least one thermal feature of the plurality of thermal features includes a body having a longitudinal axis that is perpendicular to the spreader surface of the heat spreader, a hollow bore in the body having inner diameter perpendicular to the longitudinal axis, a cap positioned at a terminal end of the body with an opening therethrough to provide fluid communication with the hollow bore, and at least one boiling enhancement coating or boiling enhancement surface feature positioned on at least one surface of the at least one thermal feature.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 4-1 is a side view of a thermal management device, according to at least one embodiment of the present disclosure;

FIG. 4-2 is a side cross-sectional view of the thermal management device of FIG. 4-1, according to at least one embodiment of the present disclosure;

FIG. 4-3 is a side detail view of the thermal management device of FIG. 4-1, according to at least one embodiment of the present disclosure;

FIG. 11-1 is a perspective view of an array of thermal features, according to at least one embodiment of the present disclosure;

FIG. 11-2 is a top view of the array of thermal features of thermal features, according to at least one embodiment of the present disclosure;

DETAILED DESCRIPTION

Figure 1:
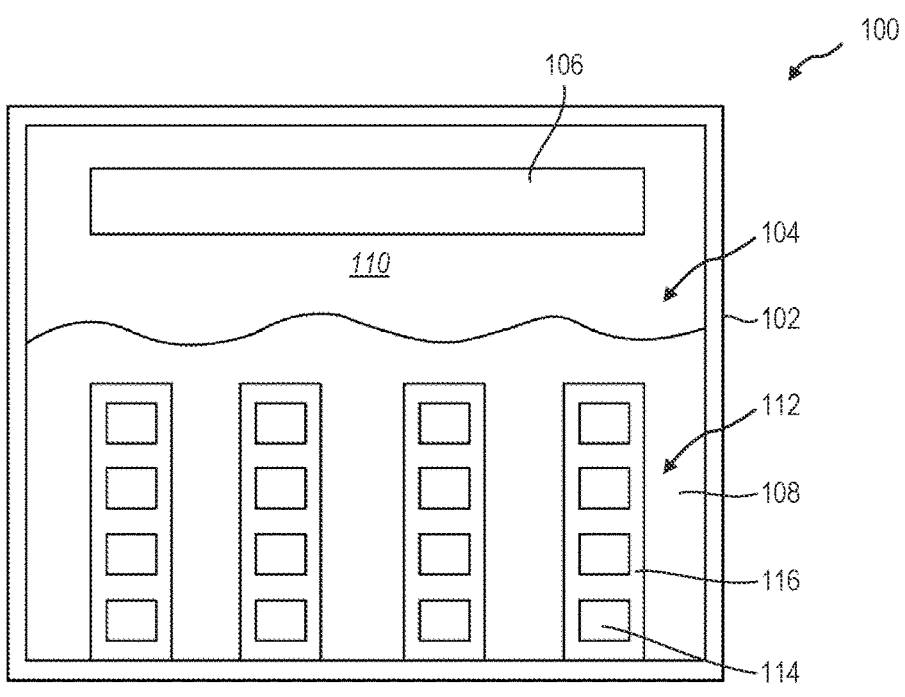
FIG. 1 is a side schematic representation of an immersion cooling system, according to at least one embodiment of the present disclosure.

The present disclosure relates generally to systems and methods for thermal management of electronic devices or other heat-generating components. In some embodiments, thermal management devices according to the present disclosure expand or enhance the nucleate boiling regime which occurs during immersion cooling of the devices to allow efficient transfer of thermal energy across a larger temperature range. In some embodiments, a thermal management device includes a pin or post to increase contact area between a surface of the thermal management device and the working fluid. The thermal management device may include a hollow bore in the pin or post to further increase contact area between a surface of the thermal management device and the cooling/working fluid.

The thermal management device may include one or more boiling enhancement coatings (BECs) and/or boiling enhancement surface features (BESFs) on a surface thereof. The BECs and/or BESFs provide additional nucleation sites to promote the formation of vapor bubbles and/or to promote the release of vapor bubbles from the surface of the thermal management device to prevent the reduction of contact area between the liquid working fluid and the surface of the thermal management device. For example, vapor bubbles that form on and remain on the surface of the thermal management device can act as an insulating film and reduce the overall contact area between the liquid working fluid and the surface of the thermal management device, thereby decreasing the rate of heat transfer.

Immersion chambers surround the heat-generating components in a working fluid, which conducts heat from the heat-generating components to cool the heat-generating components. As the working fluid absorbs heat from the heat-generating components, the temperature of the working fluid rises. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of vaporization.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid absorbs heat from the hot submerged devices and begins to boil when the temperature of the devices reaches the boiling point of the working fluid. The phase change from liquid to vapor, therefore, allows the working fluid to absorb a comparatively large amount of heat with a small or no associated increase in temperature. Further, the lower density allows the vapor to be removed from the immersion bath efficiently to exhaust the associated heat from the system.

In some examples, a step-increase in compute load produces a step-increase in vaporization rate of the working fluid by the heat-generating components, while a condenser tasked with condensing the vapor working fluid has a relatively prolonged reaction time before a steady-state is achieved. In another example, a step-decrease in compute load produces a step-decrease in vaporization rate of the working fluid by the heat-generating components, while a condenser tasked with condensing the vapor working fluid has a relatively prolonged reaction time before a steady-state is achieved. By increasing a temperature range of the nucleate boiling regime, some embodiments of thermal management devices according to the present disclosure allow an immersion cooling system to efficiently transfer heat away from a heat-generating component across a larger temperature range.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor back into the liquid phase. In some embodiments, the condenser is in fluid communication with the immersion tank by one or more conduits. In some embodiments, the condenser is positioned inside the immersion tank.

Some embodiments of an immersion cooling system 100, such as shown in FIG. 1, include an immersion tank 102 containing an immersion chamber 104 and a condenser 106 in the immersion chamber 104. The immersion chamber 104 contains an immersion working fluid that has a working fluid 108 and the vaporized working fluid 110 portion. In some embodiments, the working fluid 108 creates an immersion bath 112 in which a plurality of heat-generating components 114 are positioned to heat the working fluid 108 on supports 116.

Figure 2:
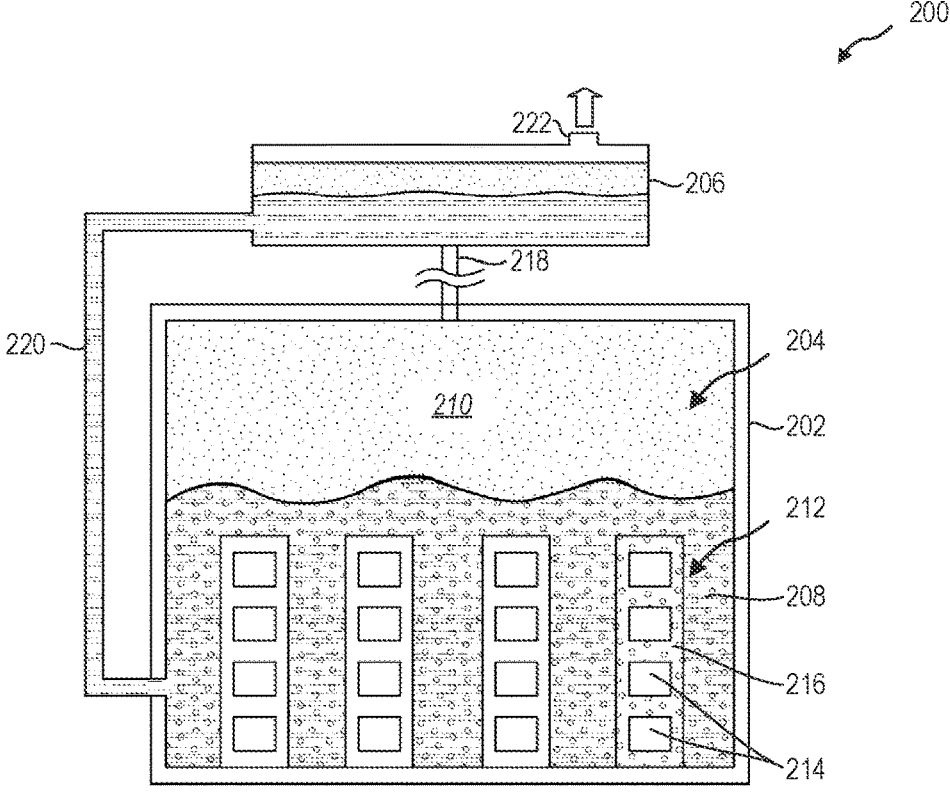
FIG. 2 is a side schematic representation of an immersion cooling system with an external condenser, according to at least one embodiment of the present disclosure.

Referring now to FIG. 2, in some embodiments, an immersion cooling system 200 includes an immersion tank 202 defining an immersion chamber 204 with an immersion working fluid positioned therein. An immersion working fluid in the immersion tank 202 has a boiling temperature that is at least partially related to one or more operating properties of the immersion cooling system, the electronic components and/or computing devices in the immersion tank 202, computational or workloads of the electronic components and/or computing devices in the immersion tank 202, external and/or environmental conditions, or other properties that affect the operation of the immersion cooling system 200. As the operating conditions of the immersion cooling system 200 change, the immersion cooling system 200 can change a mixing ratio of the immersion working fluid to change at least one property (such as boiling temperature) of the immersion working fluid.

In some embodiments, the immersion working fluid transitions between a liquid 208 phase and a vapor 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212. In some embodiments, the condenser 206 is located externally to the immersion chamber 204.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computers or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat sink of the heat-generating component 214 is a vapor chamber with one or more three-dimensional structures to increase surface area.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components 214. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiently remove the thermal energy from the working fluid. In some embodiments, an immersion cooling system 200 for thermal management of computing devices allows at least one immersion tank 202 and/or chamber 204 to be connected to and in fluid communication with an external condenser 206. In some embodiments with an external condenser 206, an immersion cooling system 200 includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air. In some embodiments, the circulation of immersion working fluid through the immersion cooling system 200 causes liquid working fluid 208 to flow past one or more heat-generating components 214. In the example of a heat-generating component 214 with a vapor chamber heat sink, the dynamics of liquid working fluid 208 may be used to move vapor chamber working fluid within the vapor chamber and/or the boiling of the immersion working fluid by the vapor chamber may drive flow of the immersion working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature above a critical temperature at which the heat-generating components experience thermal damage. The immersion working fluid should thereby receive heat from the heat-generating components to cool the heat-generating components before the heat-generating components experience damage.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes an aqueous solution. In some embodiments, the working fluid includes an electronic liquid, such as FC-72 available from 3M, or similar non-conductive fluids. In some embodiments, thermal management devices thermally connected to the heat-generating components, supports, or other elements of the immersion cooling system positioned in the working fluid have nucleation sites on a surface thereof that promote the nucleation of vapor bubbles of the working fluid at or below the boiling temperature of the working fluid. In some embodiments, the thermal management device(s) include structures, BECs, BESFs, or combinations thereof that increase a nucleate boiling regime of the working fluid when in contact with the thermal management device(s).

Figure 3:
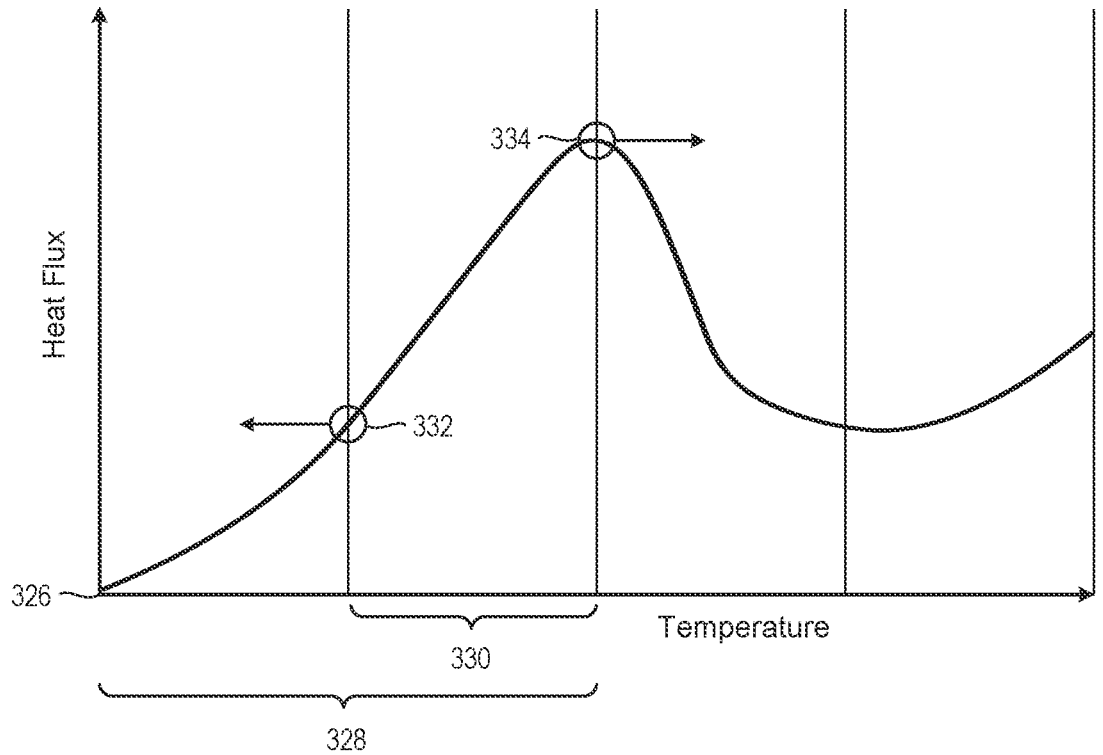
FIG. 3 is a graph illustrating thermal transfer rates relative to temperature.

FIG. 3 is a diagram of an embodiment of a thermal transfer curve illustrating a relationship between heat flux between a liquid working fluid and a superheated wall or surface which is taken from literature/past studies. The superheated wall is held at a temperature above the boiling temperature 326 of the working fluid. The heat flux (i.e., thermal transfer) increases between the boiling temperature 326 and the critical heat flux (CHF) 334 through the sub-CHF temperature range 328. In particular, the thermal transfer rate increases most rapidly in the nucleate boiling regime 330. Because the heat flux decreases at wall superheat temperatures above the CHF 334, it is most efficient to operate and cool the heat-generating components in the nucleate boiling regime 330. While film boiling can provide greater heat flux, the temperature increase in the wall superheat temperatures (i.e., component temperatures) can adversely affect the heat-generating components.

Figures 1, 4:
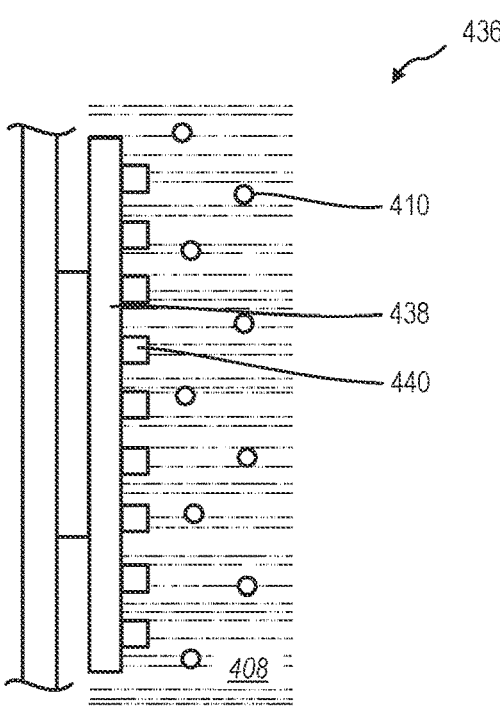
Figures 2, 4:
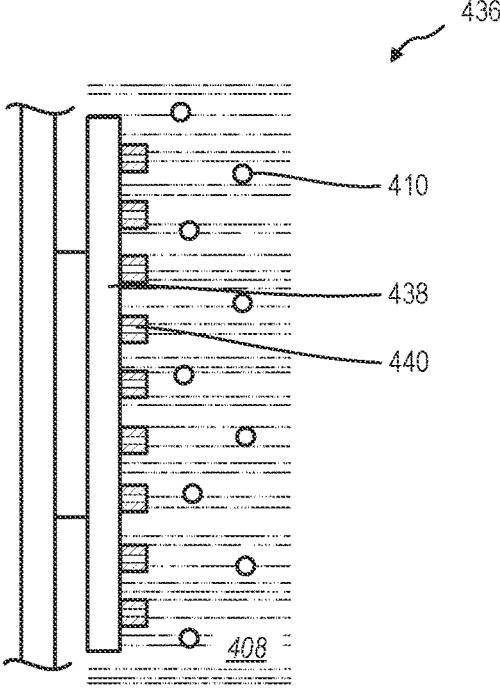
Figures 3, 4:
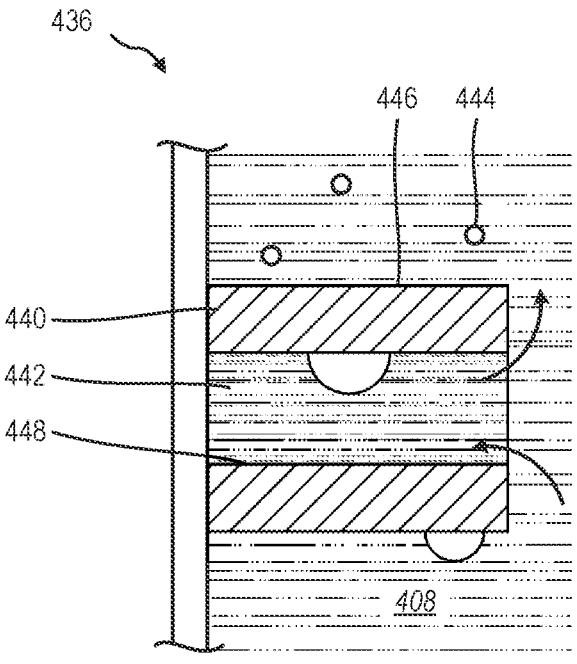

In some embodiments, thermal management devices described herein have one or more structures, geometries, BECs, BESFs, or other elements that lower the temperature of the onset of the nucleate boiling 332 and/or delay the attainment of the CHF 334. FIG. 4-1 through 4-3 illustrate an embodiment of a thermal management device 436 according to the present disclosure. FIG. 4-1 is a side view of a thermal management device 436 that is thermally connected to a heat-generating component 414.

A thermal management device or other component of a two-phase immersion or liquid cooling system that is thermally connected to a heat-generating component receives heat from the heat-generating component. For example, a thermal management device is thermally connected to a heat-generating component when the thermal management device receives heat through a conductive or convective transfer of heat. In at least one example, the thermal management device and heat-generating component are thermally connected through a thermal interface material (TIM), such as a thermal paste, a liquid metal material, or other thermally conductive material used to provide a more continuous physical contact between the thermal management device and heat-generating component.

In some embodiments, an additional component is located between the thermal management device and heat-generating component, such as a heat spreader 438. In some embodiments, the thermal management device 436 includes a heat spreader 438 integrated therewith. The heat spreader 438 may be a solid thermally conductive material, such as a metal or metal alloy slug. The heat spreader 438 may include copper, aluminum, tin, iron, or other metals used for thermal conductivity. In some embodiments, the heat spreader 438 is or includes non-solid thermal transfer elements, such as a vapor chamber, heat pipes, and other heat conduits that convectively transfer heat.

The thermal management device 436 includes a plurality of thermal features 440 that project from the thermal management device 436 and into the liquid working fluid 408 in contact with the surface of the thermal management device 436. The contact area of the thermal management device 436 and/or the thermal features 440 of the thermal management device 436 transfers heat from the heat-generating component 414 to the liquid working fluid 408, which vaporizes the liquid working fluid 408 into bubbles of vapor working fluid 410.

In some embodiments, the thermal feature(s) 440 are hollow pins, as shown in the side cross-sectional views of the thermal features 440 in FIG. 4-2 and FIG. 4-3. The hollow structure of the thermal features 440 further increases the surface area of the thermal features 440 to allow greater contact area with the liquid working fluid 408 to create bubbles of the vapor working fluid 410.

Referring to FIG. 4-3, in some embodiments, the thermal feature 440 includes a hollow bore 442 that allows flow of working fluid into the hollow bore 442. In some embodiments, vapor bubbles 444 form during nucleate boiling regime on, for example, an outer surface 446 and/or an inner surface 448 of the thermal feature 440. In the example of a cylindrical thermal feature 440, the vapor bubbles 444 formed on the outer surface 446 of the thermal feature 440 move and/or disconnect from the outer surface 446 based at least partially on the buoyancy of the vapor bubbles 444 in the liquid working fluid 408. The inner surface 448 of the hollow bore 442 may limit or resist movement of the vapor bubble 444 due to buoyancy. An inflow of liquid working fluid 408 into the hollow bore 442, in some embodiments, urges the vapor bubbles 444 from the hollow bore 442. As the vapor bubbles 444 flow upward, the fluidic drag moves liquid working fluid 408, producing a net motion of the liquid working fluid 408, further encouraging inflow into the hollow bore 442. By overcoming the adhesive force(s) attaching the vapor bubbles 444 to the thermal features, the contact surface between the liquid working fluid 408 and the thermal management device 436 is maintained, increasing the CHF temperature relative to a thermal management device with thermal features according to the present disclosure.

Figure 5:
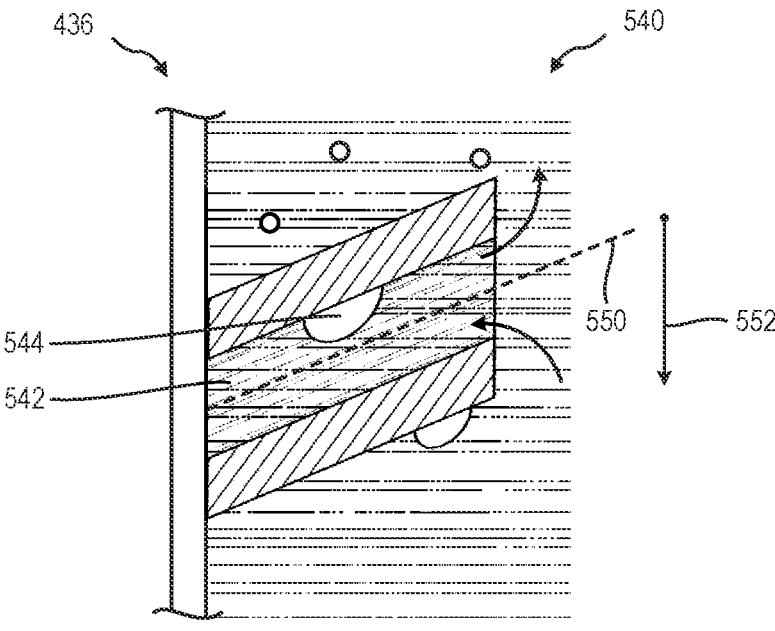
FIG. 5 is a side view of a thermal feature, according to at least one embodiment of the present disclosure.

In other embodiments, the thermal features of the thermal management device have other properties that further encourage the flow of the vapor bubbles. FIG. 5 through FIG. 12 illustrate various embodiments of hollow thermal features. FIG. 5 is a side cross-sectional view of a thermal feature 540 with a hollow bore 542 therein. The thermal feature 540 and the hollow bore 542 have a longitudinal axis 550 that is oriented at a non-perpendicular angle to a spreader surface of the heat spreader or other substrate of the thermal management device 536 from which the thermal feature 540 projects.

In some embodiments, the heat spreader 538 or other substrate of the thermal management device 536 from which the thermal feature 540 projects is supported in the immersion bath substantially parallel to a direction of gravity 552. In such embodiments, a thermal feature 540 and/or hollow bore 542 with a longitudinal axis 550 that is oriented at a non-perpendicular angle to a spreader surface causes a component of the buoyancy force of the vapor bubble(s) 544 to urge the vapor bubble 544 in the direction of the longitudinal axis 550 and out of the hollow bore 542. The exit of the vapor bubble 544 from the hollow bore 542 produces an inflow of liquid working fluid 508 to replace the vacated volume in the hollow bore 542, further producing turbulence in the working fluid to overcome adhesion forces and remove vapor bubbles 544 from the surface of the thermal feature 540, delaying CHF.

Figure 6:
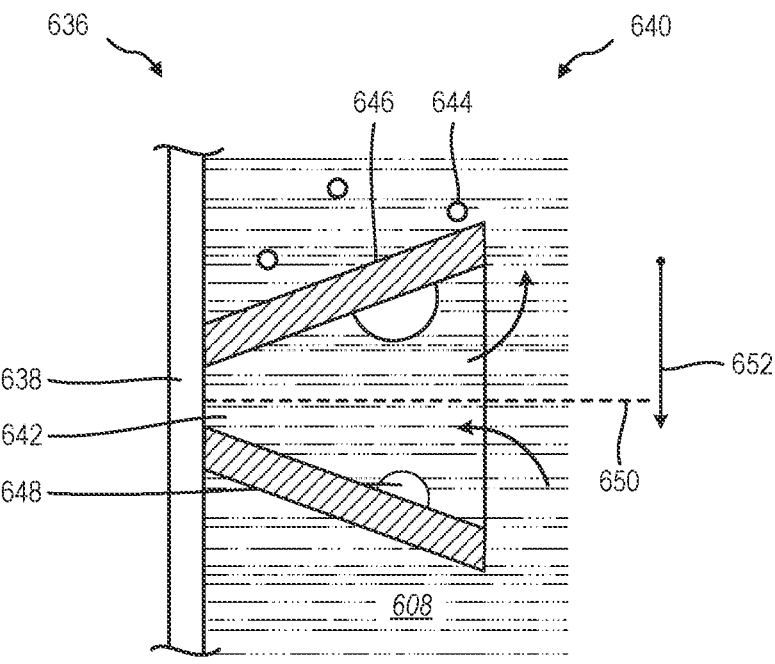
FIG. 6 is a side view of another thermal feature, according to at least one embodiment of the present disclosure.

FIG. 6 is a side cross-sectional view of a thermal feature 640 with a hollow bore 642 therein. The thermal feature 640 and the hollow bore 642 have a longitudinal axis 650 that is oriented at a perpendicular angle to a spreader surface of the heat spreader 638 or other substrate of the thermal management device 636 from which the thermal feature 640 projects. However, the thermal management device 636 and the hollow bore 642 therein both flare in a transverse direction perpendicular to the longitudinal axis 650. The outer surface 646 and the inner surface 648 are each oriented at a non-parallel orientation with the longitudinal axis 650.

In some embodiments, the heat spreader 638 or other substrate of the thermal management device 636 from which the thermal feature 640 projects is supported in the immersion bath substantially parallel to a direction of gravity 652. In such embodiments, a thermal feature 640 and/or hollow bore 642 with a longitudinal axis 650 that is oriented at a non-perpendicular angle to a spreader surface causes a component of the buoyancy force of the vapor bubble(s) 644 to urge the vapor bubble 644 in the direction of the longitudinal axis 650 and out of the hollow bore 642. The exit of the vapor bubble 644 from the hollow bore 642 produces an inflow of liquid working fluid 608 to replace the vacated volume in the hollow bore 642, further producing turbulence in the working fluid to overcome adhesion forces and remove vapor bubbles 644 from the surface of the thermal feature 640, delaying CHF.

In some embodiments, a thermal feature includes a cap affixed or integrally formed with a terminal end of the thermal feature distal from the heat spreader or substrate of the thermal management device. The cap further increases the surface area and contact area of the thermal feature. In some embodiments, the cap increases the surface area for applications with limited space between computing devices in the immersion bath, while the increased surface area distal from the heat spreader allows the cap to contact cooler liquid working fluid away from the heat spreader.

Figure 7:
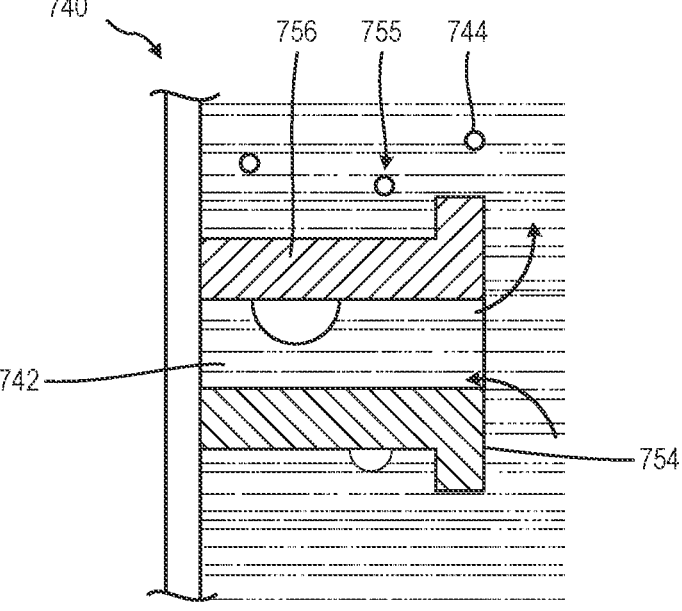
FIG. 7 is a side view of a thermal feature with an integral cap, according to at least one embodiment of the present disclosure.

FIG. 7 is a side cross-sectional view of a thermal feature 740 with a hollow bore 742 therein. The thermal feature 740 has a cap 754 with a greater outside diameter than that of the body 756 positioned at a terminal end 755 of the thermal feature 740. The cap 754 increases the surface area and contact area of the thermal feature 740 and helps in delaying the attainment of the CHF. In some embodiments, the cap 754 is integrally formed with the body 756 of the thermal feature 740. For example, the cap 754 and body 756 may be formed in a single continuous piece of material, such as via additive manufacturing, casting, forging, sintering, or other forming of a piece of material without interfaces between discrete parts.

Figure 8:
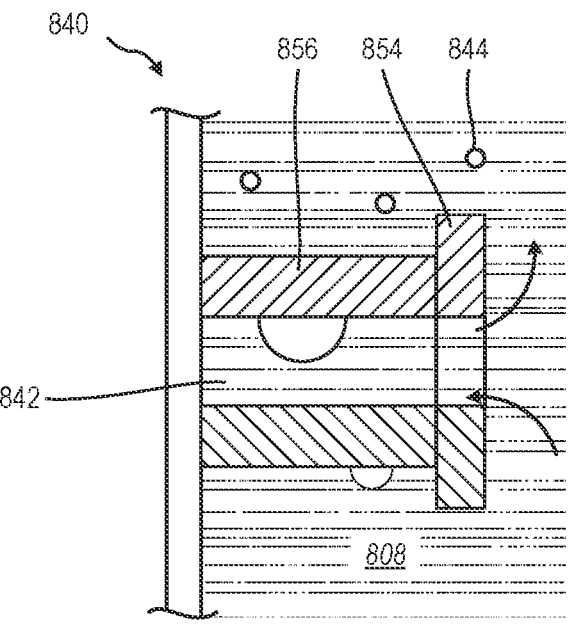
FIG. 8 is a side view of a thermal feature with a cap affixed thereto, according to at least one embodiment of the present disclosure.

In some embodiments, the cap 854 is an annular or other shaped structure that is affixed, adhered, welded, or otherwise connected to the body 856, such as illustrated in the side cross-sectional view of the embodiment in FIG. 8. The cap 854 includes an opening therethrough that allows fluid communication through the cap 854 to the hollow bore 842 of the thermal feature 840. The fluid communication through opening allows vapor bubbles 844 to exit the hollow bore 842 and allow inflow of liquid working fluid 808 to replace the volume of the insulating vapor layer/bubble 844.

FIG. 4-1 through FIG. 8 illustrate some embodiments of thermal features with bodies having substantially constant thickness throughout the body. For example, a thickness of the body may be substantially constant in the longitudinal direction. In some examples, a thickness of the body may be substantially constant in the rotational direction around the longitudinal axis of the thermal feature. In some embodiments, however, a thickness of a body (e.g., between the inner surface and the outer surface) may change in or more directions. For example, a thickness of the body may change in the longitudinal direction. In some examples, a thickness of the body may change in the rotational direction around the longitudinal axis of the thermal feature.

Figure 9:
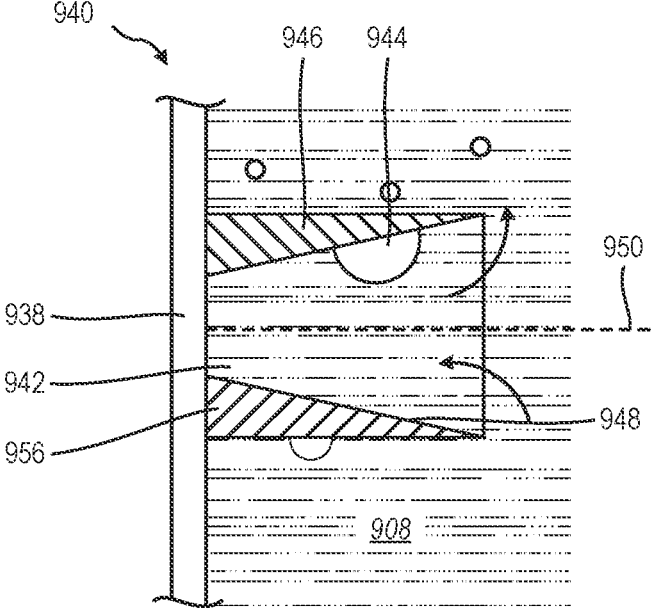
FIG. 9 is a side view of a tapered thermal feature, according to at least one embodiment of the present disclosure.

FIG. 9 is a side cross-sectional view of an embodiment of a thermal feature 940 having a body thickness of a body 956 that tapers in the distal direction away from the heat spreader 938 or other substrate from which the thermal feature 940 projects. In some embodiments, the outer surface 946 of the body 956 is substantially parallel to the longitudinal axis 950 while the inner surface 948 increases in inner diameter relative to the longitudinal axis 950 in the distal direction. In some embodiments, the body thickness tapers in the distal longitudinal direction while the outer diameter of the body 956 decreases or increases relative to the longitudinal axis 950.

In some embodiments, the tapering body 956 allows the buoyancy force of the vapor bubbles 944 to have at least a component of the buoyancy force that urges the vapor bubble 944 from the hollow bore 942. The vapor bubble 944 may then exit the hollow bore 942 and allow inflow of liquid working fluid 908 into the bore 942 to replace the volume vacated by the vapor bubble 944.

Figure 10:
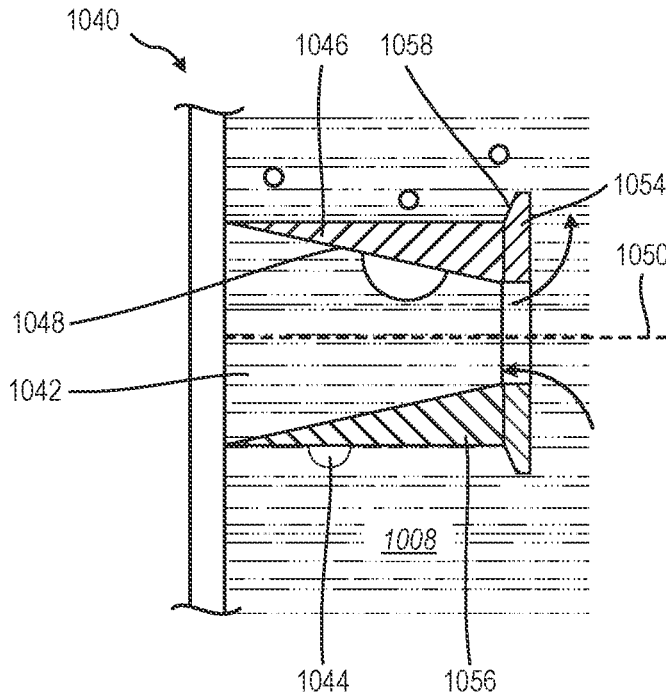
FIG. 10 is a side view of another tapered thermal feature, according to at least one embodiment of the present disclosure.

In other embodiments, the body thickness increases in the distal direction. For example, FIG. 10 is a side cross-sectional view of a thermal feature 1040 with a substantially constant inner diameter of the inner surface 1048 of the hollow bore 1042, while an outer diameter of an outer surface 1046 increases in the distal direction relative to a longitudinal axis 1050. In some embodiments, the constant inner diameter allows the exit of vapor bubbles 1044 and inflow of liquid working fluid 1008 while the sloped outer surface 1046 allows the buoyancy force of the vapor bubbles 1044 to have at least a component of the buoyancy force that urges the vapor bubble 1044 longitudinally on the outer surface 1046.

In some embodiments, the inner surface 1048 of the body 1056 is substantially parallel to the longitudinal axis 1050 while the outer surface 1046 increases in outer diameter relative to the longitudinal axis 1050 in the distal direction. In some embodiments, the body thickness increases in the distal longitudinal direction while the inner diameter of the inner surface 1048 decreases or increases relative to the longitudinal axis 1050.

FIG. 10 also illustrates a cap 1054 affixed to the distal end of the body 1056 with a beveled proximal edge 1058. In some embodiments, a beveled or curved proximal edge 1058 and/or distal edge may allow for more efficiently flow of vapor bubbles 1044 and/or liquid working fluid 1008 around the distal end of the thermal feature 1040, improving the release of vapor bubbles 1044 from the surfaces of the thermal feature 1040.

While FIG. 5 through FIG. 10 illustrate individual embodiments of thermal features, it should be understood that a thermal management device according to the present disclosure may include a plurality of thermal features in an array. The array may include a plurality of similar or identical thermal features, such as any embodiments described herein, or a combination of different thermal features, such as a combination of any of the embodiments of thermal features described herein.

Figures 1, 11:
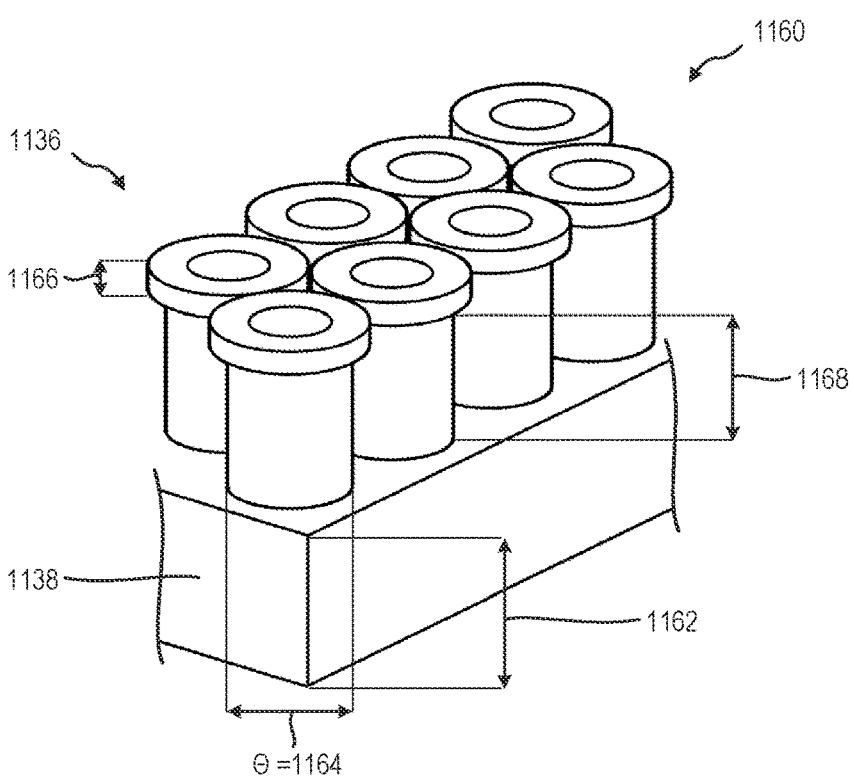
Figures 2, 11:
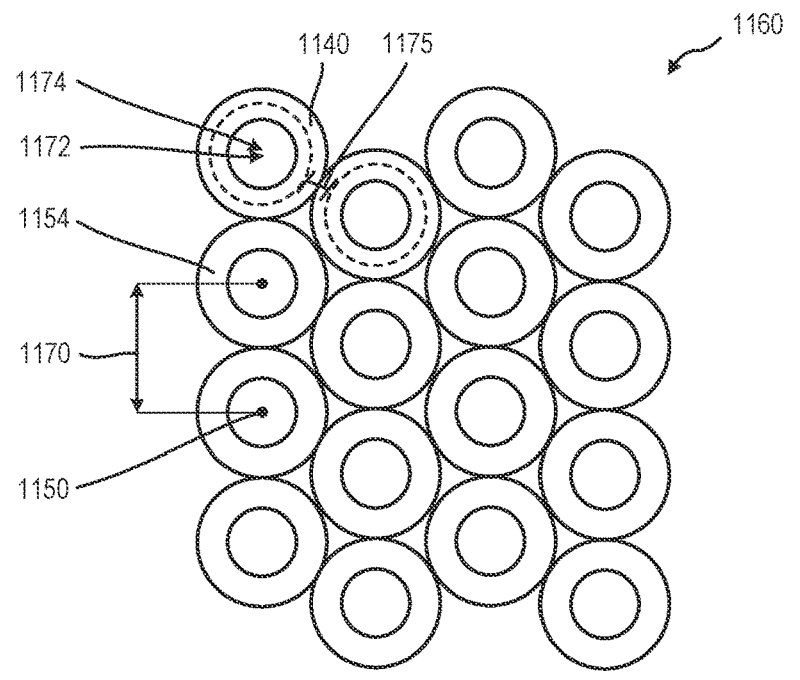

FIG. 11-1 is a perspective view of a thermal management device 1136 including a plurality of thermal features 1140 in an array 1160 on a heat spreader 1138 or other substrate. In some embodiments, the heat spreader 1148 or other substrate has a substrate thickness 1162 in a range having an upper value, a lower value, or upper and lower values including any of 0.5 millimeters (mm), 0.75 mm, 1.0 mm, 1.25 mm, 1.50 mm, 1.75 mm, 2.0 mm, or any values therebetween. For example, the substrate thickness 1162 may be greater than 0.5 mm. In some examples, the substrate thickness 1162 may be less than 2.0 mm. In some examples, the substrate thickness 1162 may be between 0.5 mm and 2.0 mm. In some examples, the substrate thickness 1162 may be between 1.0 mm and 1.75 mm. In some examples, the substrate thickness 1162 may be between 1.25 mm and 1.50 mm. In at least one example, the substrate thickness 1162 is approximately 1.4 mm.

In some embodiments, the thermal feature 1140 has a maximum outer body diameter 1164 in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the maximum outer body diameter 1164 may be greater than 0.5 mm. In some examples, the maximum outer body diameter 1164 may be less than 2.0 mm. In some examples, the maximum outer body diameter 1164 may be between 0.5 mm and 2.0 mm. In some examples, the maximum outer body diameter 1164 may be between 0.75 mm and 1.25 mm. In at least one example, the maximum outer body diameter 1164 is approximately 0.8 mm.

In some embodiments, the thermal feature 1140 has a cap height 1166 in a longitudinal direction in a range having an upper value, a lower value, or upper and lower values including any of 0.05 mm, 0.075 mm, 0.10 mm, 0.125 mm, 0.15 mm, 0.175 mm, 0.20 mm, or any values therebetween. For example, the cap height 1166 may be greater than 0.05 mm. In some examples, the cap height 1166 may be less than 0.20 mm. In some examples, the cap height 1166 may be between 0.05 mm and 0.20 mm. In some examples, the cap height 1166 may be between 0.075 mm and 0.125 mm. In at least one example, the cap height 1166 is approximately 0.1 mm. In some embodiments, the cap height 1166 is less than 20% of a height 1168 of the body 1156.

In some embodiments, the thermal feature 1140 has a height 1168 in a longitudinal direction in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the height 1168 may be greater or smaller than 0.5 mm. In some examples, the height 1168 may be less than 2.0 mm. In some examples, the height 1168 may be between 0.5 mm and 2.0 mm. In some examples, the height 1168 may be between 0.75 mm and 1.25 mm. In at least one example, the height 1168 is approximately 1.1 mm.

The array 1160 may arrange the thermal features 1140 in a uniform pattern or a non-uniform pattern. In some embodiments, the thermal features 1140 are arranged in a repeating hexagonal close-pack array 1160. In some embodiments, the thermal features 1140 are arranged in a repeating square array. In some embodiments, the thermal features 1140 are arranged in an irregular, non-repeating array.

FIG. 11-2 is a top view of the array 1160 of FIG. 11-1. The thermal features 1140 are spaced apart at a constant spacing 1170 based on the relative locations of the longitudinal axis 1150 of each thermal feature 1140. In some embodiments, the spacing 1170 is in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the spacing 1170 may be greater than 0.5 mm. In some examples, the spacing 1170 may be less than 2.0 mm. In some examples, the spacing 1170 may be between 0.5 mm and 2.0 mm. In some examples, the spacing 1170 may be between 0.75 mm and 1.25 mm. In at least one example, the spacing 1170 is approximately 1.0 mm.

In some embodiments, the thermal feature 1140 has an inner diameter 1172 in a transverse direction in a range having an upper value, a lower value, or upper and lower values including any of 0.2 mm, 0.3 mm, 0.4 mm, 0.5 mm, 0.6 mm, 0.7 mm, 0.8 mm, 0.9 mm, 1.0 mm, or any values therebetween. For example, the inner diameter 1172 may be greater than 0.2 mm. In some examples, the inner diameter 1172 may be less than 1.0 mm. In some examples, the inner diameter 1172 may be between 0.2 mm and 1.0 mm. In some examples, the inner diameter 1172 may be between 0.35 mm and 0.75 mm. In at least one example, the inner diameter 1172 is approximately 0.5 mm.

In some embodiments, the thermal feature 1140 has a cap outer diameter 1174 that is greater than a body outer diameter, and the cap outer diameter 1174 is in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the cap outer diameter 1174 may be greater than 0.5 mm. In some examples, the cap outer diameter 1174 may be less than 2.0 mm. In some examples, the cap outer diameter 1174 may be between 0.5 mm and 2.0 mm. In some examples, the cap outer diameter 1174 may be between 0.75 mm and 1.25 mm. In at least one example, the cap outer diameter 1174 is approximately 1.0 mm. In some embodiments, a cap outer diameter is at least 50% larger than the outer body diameter (such as the outer body diameter 1164 described in relation to FIG. 11-1).

In some embodiments, the caps 1154 of adjacent thermal features 1140 contact one another. For example, contacting or connected caps 1154 may allow the caps 1154 to thermally conduct between the caps 1154. In some embodiments, the caps 1154 of adjacent thermal features 1140 do not contact one another, allowing more clearance for fluid flow between caps 1154 and thermal features 1140.

In some embodiments, a gap 1175 between a body of a first thermal feature of the array of thermal features and a body of a second thermal feature of the array of thermal features. In some embodiments, the gap 1175 is in a range having an upper value, a lower value, or upper and lower values including any of 0.2 mm, 0.3 mm, 0.4 mm, 0.5 mm, 0.75 mm, 1.0 mm, 1.25 mm, 1.50 mm, or any values therebetween. For example, the gap 1175 may be at least than 0.2 mm. In some examples, the gap 1175 may be no more than 1.5 mm. In some examples, the gap 1175 may be between 0.2 mm and 1.5 mm. In some examples, the gap 1175 may be between 0.4 mm and 1.0 mm. In at least one example, the gap 1175 is approximately 0.5 mm.

Various embodiments of thermal features have been described herein that expand the nucleate boiling regime for more efficient thermal transfer in immersion or liquid cooling systems. In some embodiments, the thermal feature includes a BEC and/or BESF to promote boiling and further expand the nucleate boiling regime. It should be understood that an embodiment of a thermal structure described herein may include a BEC or BESF on one or more surfaces thereof. For example, any of the embodiments describe in relation to FIG. 4-1 through FIG. 11-2 or elsewhere herein may include a BEC or BESF.

Figure 12:
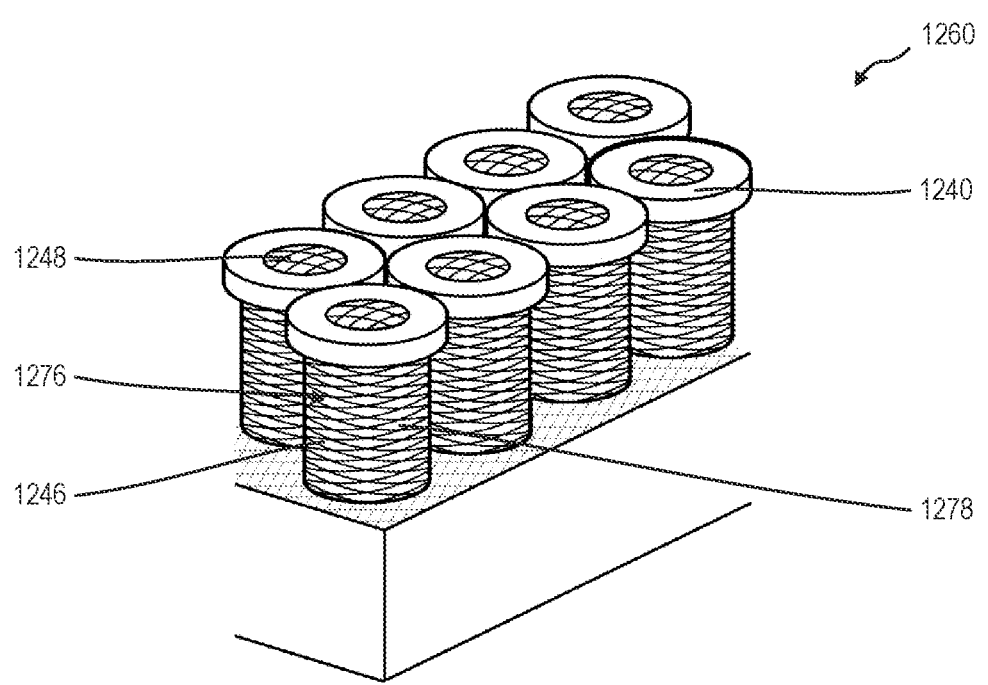
FIG. 12 is a perspective view of an array of thermal features with nucleation sites, according to at least one embodiment of the present disclosure.

FIG. 12 illustrates an embodiment of an array 1260 of thermal features 1240 with BESFs 1276 on an outer surface 1246 thereof and on an inner surface 1248 thereof. The BESFs 1276 provide nucleation sites 1278 on the thermal features 1240 that promote the formation and/or release of vapor bubbles. The nucleation sites 1278 promote boiling to reduce the onset temperature of the nucleate boiling regime. In some embodiments, BECs, such as those created by chemical vapor deposition, physical vapor deposition, electroplating, or other deposition techniques or BESFs, such as those created through deposition or subtractive methods such as ion etching, chemical etching, or other methods, create uneven surfaces that promote the formation and/or release of vapor bubbles to reduce the onset temperature of the nucleate boiling regime.

Figure 13:
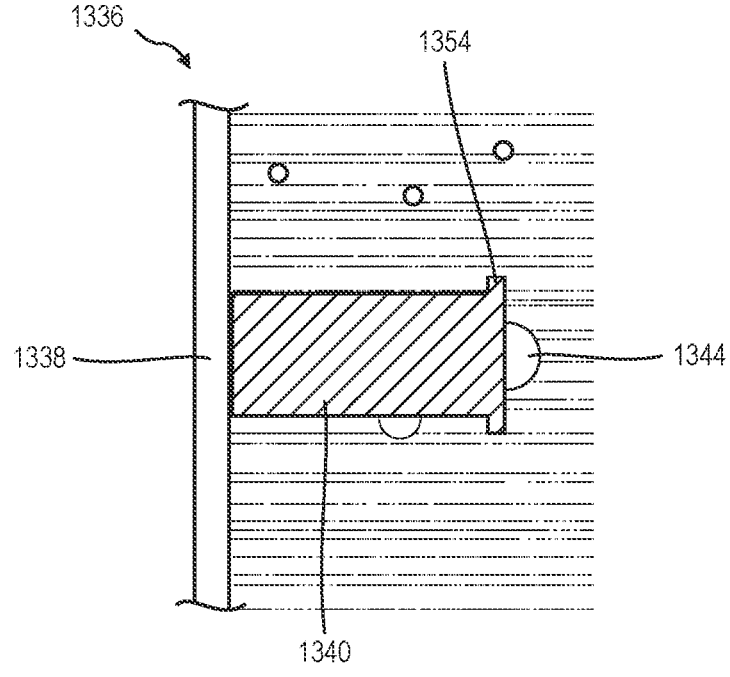
FIG. 13 is a side cross-sectional view of solid thermal feature, according to at least one embodiment of the present disclosure.

In some embodiments, the BECs and BESFs can be applied to or formed in the surface of solid thermal features, such as thermal features lacking a hollow bore and having features on the walls. FIG. 13 is a side cross-sectional view of a thermal feature 1340 with a solid body with features 1356 and a cap 1354 thereon. The cap 1354 provides additional surface area distal from the spreader surface of the heat spreader 1338 or other substrate of the thermal management device 1336. The cap 1354 can allow an increase in surface area and also promote the formation of vapor bubbles 1344 away from the spreader surface. A solid thermal feature, according to some embodiments of the present disclosure may have any dimensions of a body and/or cap described herein.

Figure 14:
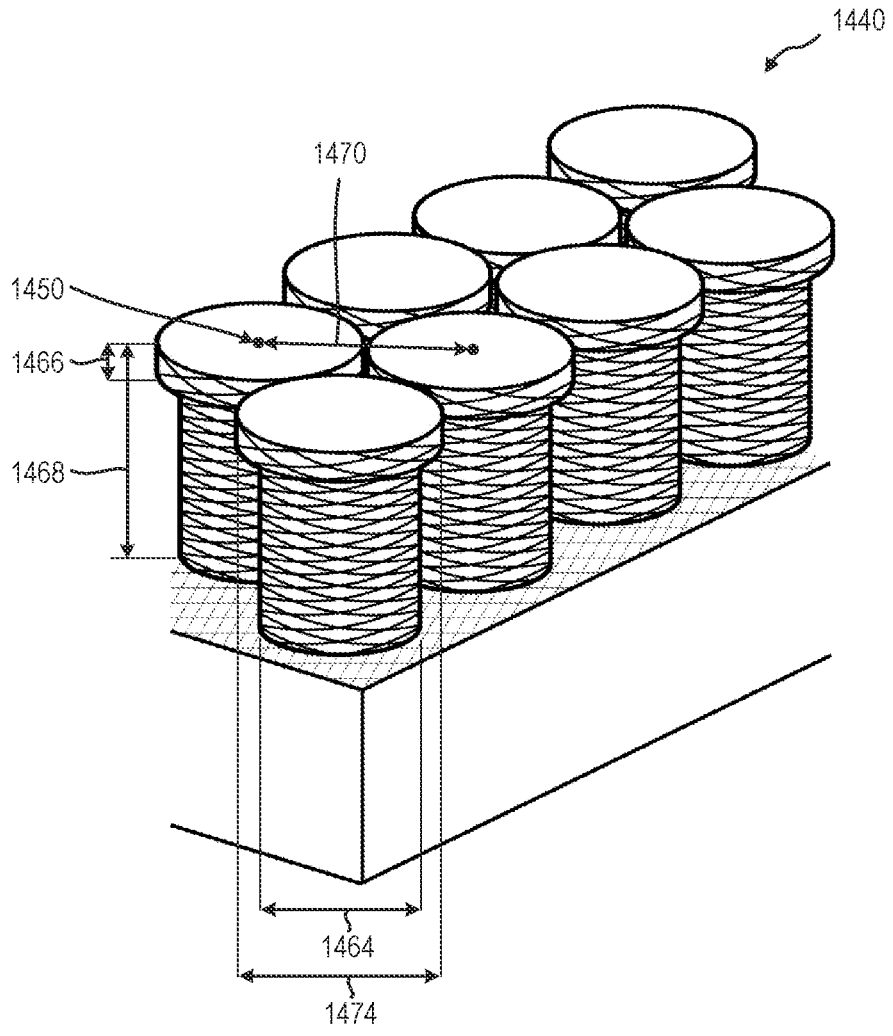
FIG. 14 is a perspective view of an array of solid thermal features, according to at least one embodiment of the present disclosure.

Referring now to FIG. 14, in some embodiments, the thermal feature 1440 has a maximum outer body diameter 1464 in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the maximum outer body diameter 1464 may be greater than 0.5 mm. In some examples, the maximum outer body diameter 1464 may be less than 2.0 mm. In some examples, the maximum outer body diameter 1464 may be between 0.5 mm and 2.0 mm. In some examples, the maximum outer body diameter 1464 may be between 0.75 mm and 1.25 mm. In at least one example, the maximum outer body diameter 1464 is approximately 0.8 mm.

In some embodiments, the thermal feature with additional micro features 1440 has a cap height 1466 in a longitudinal direction in a range having an upper value, a lower value, or upper and lower values including any of 0.05 mm, 0.075 mm, 0.10 mm, 0.125 mm, 0.15 mm, 0.175 mm, 0.20 mm, or any values therebetween. For example, the cap height 1466 may be greater than 0.05 mm. In some examples, the cap height 1466 may be less than 0.20 mm. In some examples, the cap height 1466 may be between 0.05 mm and 0.20 mm. In some examples, the cap height 1466 may be between 0.075 mm and 0.125 mm. In at least one example, the cap height 1466 is approximately 0.1 mm.

In some embodiments, the thermal feature 1440 has a height 1468 in a longitudinal direction in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the height 1468 may be greater than 0.5 mm. In some examples, the height 1468 may be less than 2.0 mm. In some examples, the height 1468 may be between 0.5 mm and 2.0 mm. In some examples, the height 1468 may be between 0.75 mm and 1.25 mm. In at least one example, the height 1468 is approximately 1.1 mm.

In some embodiments, the thermal features 1440 are spaced apart at a constant spacing 1470 based on the relative locations of the longitudinal axis 1450 of each thermal feature 1440. In some embodiments, the spacing 1470 is in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the spacing 1470 may be greater than 0.5 mm. In some examples, the spacing 1470 may be less than 2.0 mm. In some examples, the spacing 1470 may be between 0.5 mm and 2.0 mm. In some examples, the spacing 1470 may be between 0.75 mm and 1.25 mm. In at least one example, the spacing 1470 is approximately 1.0 mm.

In some embodiments, the thermal feature 1440 has a cap outer diameter 1474 that is greater than a body outer diameter, and the cap outer diameter 1474 is in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the cap outer diameter 1474 may be greater than 0.5 mm. In some examples, the cap outer diameter 1474 may be less than 2.0 mm. In some examples, the cap outer diameter 1474 may be between 0.5 mm and 2.0 mm. In some examples, the cap outer diameter 1474 may be between 0.75 mm and 1.25 mm. In at least one example, the cap outer diameter 1474 is approximately 1.0 mm.

Figure 15:
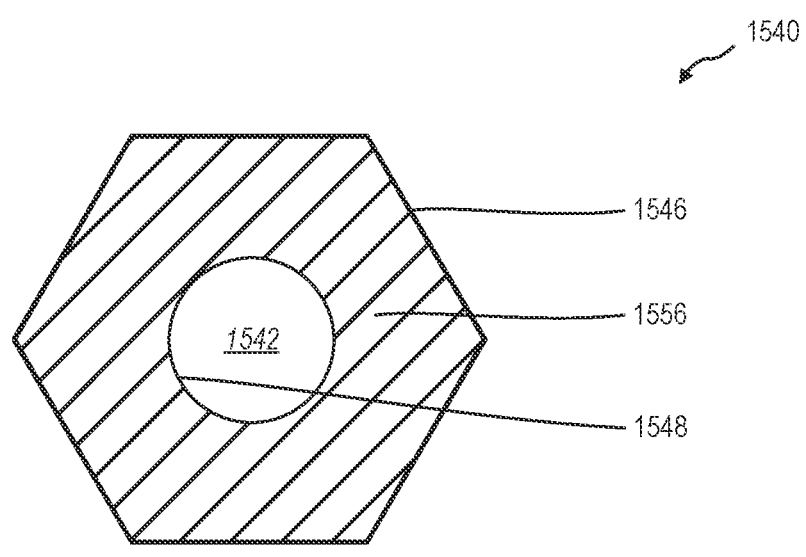
FIG. 15 is a transverse cross-sectional view of a thermal feature with different outer surface and inner surface shapes, according to at least one embodiment of the present disclosure.

Embodiments of thermal features have been described herein with a body having a cylindrical outer surface and a cylindrical inner surface. However, it should be understood that embodiments of thermal features according to the present disclosure may have other cross-sectional shapes than circle, and the shape of the outer surface may be different from that of an inner surface. FIG. 15 illustrates a transverse cross-section of a body 1556 of a thermal feature 1540. The body 1556 has an outer surface 1546 that is a different shape than an inner surface 1548 of the body 1556 proximate a bore 1542. In some embodiments, the outer surface 1546 has a cross-sectional shape including any of a circle, an ellipse, other shape with at least partially curved portions, a triangle, a square, a rectangle, a pentagon, a hexagon, another regular polygon, irregular polygon, irregular shape, or combinations thereof. In some embodiments, the inner surface 1548 has a cross-sectional shape including any of a circle, an ellipse, other shape with at least partially curved portions, a triangle, a square, a rectangle, a pentagon, a hexagon, another regular polygon, irregular polygon, irregular shape, or combinations thereof.

Figure 16:
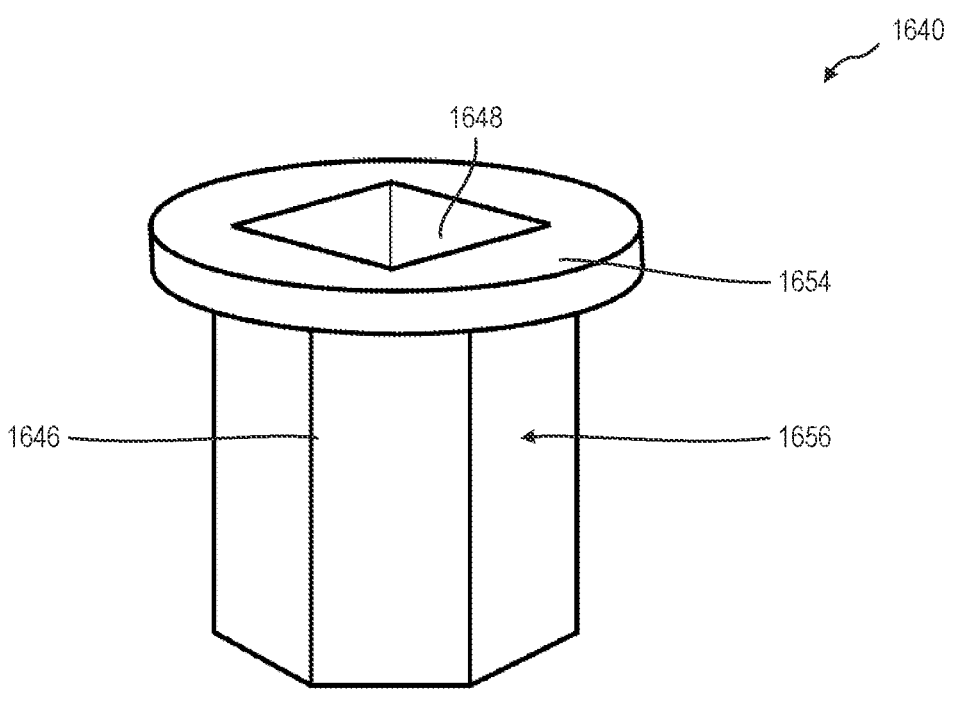
FIG. 16 is a perspective view of a thermal feature with different outer surface and inner surface shapes, according to at least one embodiment of the present disclosure.

FIG. 16 is a perspective view of an embodiment of a thermal feature 1640 wherein the cap 1654 has a different outer shape than the outer surface 1646 of the body 1656. In some embodiments, the cap 1654 has a different outer shape than the inner surface 1648 of the body 1656. In some embodiments, the cap 1654 has a cross-sectional shape including any of a circle, an ellipse, other shape with at least partially curved portions, a triangle, a square, a rectangle, a pentagon, a hexagon, another regular polygon, irregular polygon, irregular shape, or combinations thereof.

In at least some embodiments according to the present disclosure, a thermal feature provides a surface area and/or surface features or coatings that expands the nucleate boiling regime to provide efficient thermal transfer in a two-phase immersion or liquid cooling system over a larger temperature range than a conventional heat spreader. The thermal features are generally shown as being uniform in size, shape, and spacing across a surface. In at least one embodiment according to the present disclosure, one or more thermal features may vary in size, shape, spacing, material, other characteristics, or combinations thereof. For example, one or more thermal features near a center of the surface may be larger than one or more thermal features near an edge of the surface. In another example, a plurality of thermal features near a center of the surface may be spaced more densely than a plurality of thermal features near an edge of the surface. In a further example, a plurality of thermal features near a center of the surface may be larger and/or spaced more densely than a plurality of thermal features near an edge of the surface. Other combinations are also contemplated.

INDUSTRIAL APPLICABILITY

The present disclosure relates generally to systems and methods for thermal management of electronic devices or other heat-generating components. In some embodiments, thermal management devices according to the present disclosure expand or enhance a nucleate boiling regime of thermal transfer to allow efficient transfer of thermal energy across a larger temperature range. In some embodiments, a thermal management device includes a pin or post to increase contact area between a surface of the thermal management device and the liquid working fluid. The thermal management device may include a hollow bore in the pin or post to further increase contact area between a surface of the thermal management device and the liquid working fluid.

The thermal management device may include one or more boiling enhancement coatings (BECs) and/or boiling enhancement surface features (BESFs) on a surface thereof. The BECs and/or BESFs provide additional nucleation sites to promote the formation of vapor bubbles and/or to promote the release of vapor bubbles from the surface of the thermal management device to prevent the reduction of contact area between the liquid working fluid and the surface of the thermal management device. For example, vapor bubbles that form on and remain on the surface of the thermal management device can reduce the overall contact area between the liquid working fluid and the surface of the thermal management device. Because a thermal transfer rate between the surface of the thermal management device and liquid working fluid is greater than a thermal transfer rate between the surface of the thermal management device and vapor working fluid, the cooling capacity of the thermal management device is reduced as more of the surface area is occupied by vapor bubbles.

Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads.

In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small or no associated increase in temperature. Further, the lower density allows the vapor to be removed from the immersion bath efficiently to exhaust the associated heat from the system.

In some examples, a step-increase in compute load produces a step-increase in vaporization rate of the working fluid by the heat-generating components, while a condenser tasked with condensing the vapor working fluid has a relatively prolonged reaction time before a steady-state is achieved. In another example, a step-decrease in compute load produces a step-decrease in vaporization rate of the working fluid by the heat-generating components, while a condenser tasked with condensing the vapor working fluid has a relatively prolonged reaction time before a steady-state is achieved. By increasing a temperature range of the nucleate boiling regime, some embodiments of thermal management devices according to the present disclosure allow an immersion cooling system to efficiently transfer heat away from a heat-generating component across a larger temperature range.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

Some embodiments of an immersion cooling system include an immersion tank containing an immersion chamber and a condenser in the immersion chamber. The immersion chamber contains an immersion working fluid that has a liquid working fluid and a vapor working fluid portion. In some embodiments, the liquid working fluid creates an immersion bath in which a plurality of heat-generating components are positioned to heat the liquid working fluid on supports.

In some embodiments, an immersion cooling system includes an immersion tank defining an immersion chamber with an immersion working fluid positioned therein. An immersion working fluid in the immersion tank has a boiling temperature that is at least partially related to one or more operating properties of the immersion cooling system, the electronic components and/or computing devices in the immersion tank, computational or workloads of the electronic components and/or computing devices in the immersion tank, external and/or environmental conditions, or other properties that affect the operation of the immersion cooling system. As the operating conditions of the immersion cooling system change, the immersion cooling system can change a mixing ratio of the immersion working fluid to change at least one property (such as boiling temperature) of the immersion working fluid.

In some embodiments, the immersion working fluid transitions between a liquid working fluid phase and a vapor working fluid phase to remove heat from hot or heat-generating components in the immersion chamber. The liquid working fluid more efficiency receives heat from the heat-generating components and, upon transition to the vapor working fluid, the vapor working fluid can be removed from the immersion tank, cooled and condensed by the condenser (or other heat exchanger) to extract the heat from the working fluid, and the liquid working fluid can be returned to the liquid immersion bath. In some embodiments, the condenser is located externally to the immersion chamber.

In some embodiments, the immersion bath of the liquid working fluid has a plurality of heat-generating components positioned in the liquid working fluid. The liquid working fluid surrounds at least a portion of the heat-generating components 24 and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the liquid working fluid may remove heat through convective cooling.

In some embodiments, the heat-generating components include electronic or computing components or power supplies. In some embodiments, the heat-generating components include computer devices, such as individual personal computers or server blade computers. In some embodiments, one or more of the heat-generating components includes a heat sink or other device attached to the heat-generating component to conduct away thermal energy and effectively increase the surface area of the heat-generating component. In some embodiments, the heat sink of the heat-generating component is a vapor chamber with one or more three-dimensional structures to increase surface area.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor working fluid rises in the liquid working fluid, the vapor working fluid can be extracted from the immersion chamber in an upper vapor region of the chamber. A condenser cools part of the vapor working fluid back into a liquid working fluid, removing thermal energy from the system and reintroducing the working fluid into the immersion bath of the liquid working fluid. The condenser radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiency remove the thermal energy from the working fluid. In some embodiments, an immersion cooling system for thermal management of computing devices allows at least one immersion tank and/or chamber to be connected to and in fluid communication with an external condenser. In some embodiments with an external condenser, an immersion cooling system includes a vapor return line that connects the immersion tank to the condenser and allows vapor working fluid to enter the condenser from the immersion tank and/or chamber and a liquid return line that connects the immersion tank to the condenser and allows liquid working fluid to return to the immersion tank and/or chamber.

The vapor return line may be colder than the boiling temperature of the working fluid. In some embodiments, a portion of the vapor working fluid condenses in the vapor return line. The vapor return line can, in some embodiments, be oriented at an angle such that the vapor return line is non-perpendicular to the direction of gravity. The condensed working fluid can then drain either back to the immersion tank or forward to the condenser depending on the direction of the vapor return line slope. In some embodiments, the vapor return line includes a liquid collection line or valve, like a bleeder valve, that allows the collection and/or return of the condensed working fluid to the immersion tank or condenser.

In some examples, an immersion cooling system includes an air-cooled condenser. An air-cooled condenser may require fans or pumps to force ambient air over one or more heat pipes or fins to conduct heat from the condenser to the air. In some embodiments, the circulation of immersion working fluid through the immersion cooling system causes liquid working fluid to flow past one or more heat-generating components. In the example of a heat-generating component with a vapor chamber heat sink, the dynamics of liquid working fluid may be used to move vapor chamber working fluid within the vapor chamber and/or the boiling of the immersion working fluid by the vapor chamber may drive flow of the immersion working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70°

C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FC-72 available from 3M, or similar nonconductive fluids. In some embodiments, thermal management devices thermally connected to the heat-generating components, supports, or other elements of the immersion cooling system positioned in the working fluid have nucleation sites on a surface thereof that promote the nucleation of vapor bubbles of the working fluid at or below the boiling temperature of the working fluid. In some embodiments, the thermal management device(s) include structures, BECs, BESFs, or combinations thereof that increase a nucleate boiling regime of the working fluid when in contact with the thermal management device(s).

A thermal management device or other component of a two-phase immersion or liquid cooling system that is thermally connected to a heat-generating component receives heat from the heat-generating component. For example, a thermal management device is thermally connected to a heat-generating component when the thermal management device receives heat through a conductive or convective transfer of heat. In at least one example, the thermal management device and heat-generating component are thermally connected through a thermal interface material (TIM), such as a thermal paste, a liquid metal material, or other thermally conductive material used to provide a more continuous physical contact between the thermal management device and heat-generating component.

In some embodiments, an additional component is located between the thermal management device and heat-generating component, such as a heat spreader. In some embodiments, the thermal management device includes a heat spreader integrated therewith. The heat spreader may be a solid thermally conductive material, such as a metal or metal alloy slug. The heat spreader may include copper, aluminum, tin, iron, or other metals used for thermal conductivity. In some embodiments, the heat spreader is or includes nonsolid thermal transfer elements, such as a vapor chamber, heat pipes, and other heat conduits that convectively transfer heat.

The thermal management device includes a plurality of thermal features that project from the thermal management device and into the liquid working fluid in contact with the surface of the thermal management device. The contact area of the thermal management device and/or the thermal features of the thermal management device transfers heat from the heat-generating component to the liquid working fluid, which vaporizes the liquid working fluid into bubbles of vapor working fluid.

In some embodiments, the thermal feature(s) are hollow pins. The hollow structure of the thermal features further increases the surface area of the thermal features to allow greater contact area with the liquid working fluid to create bubbles of the vapor working fluid.

In some embodiments, the thermal feature includes a hollow bore that allows flow of working fluid into the hollow bore. In some embodiments, vapor bubbles form during nucleate boiling regime on, for example, an outer surface and/or an inner surface of the thermal feature. In the example of a cylindrical thermal feature, the vapor bubbles formed on the outer surface of the thermal feature move and/or disconnect from the outer surface based at least partially on the buoyancy of the vapor bubbles in the liquid working fluid. The inner surface of the hollow bore may limit or resist movement of the vapor bubble due to buoyancy. An inflow of liquid working fluid into the hollow bore, in some embodiments, urges the vapor bubbles from the hollow bore. As the vapor bubbles flow upward, the fluidic drag moves liquid working fluid, producing a net motion of the liquid working fluid, further encouraging inflow into the hollow bore. By overcoming the adhesive force(s) attaching the vapor bubbles to the thermal features, the contact surface between the liquid working fluid and the thermal management device is maintained, increasing the CHF temperature relative to a thermal management device with thermal features according to the present disclosure.

In other embodiments, the thermal features of the thermal management device have other properties that further encourage the flow of the vapor bubbles. The thermal feature and the hollow bore have a longitudinal axis that is oriented at a non-perpendicular angle to a spreader surface of the heat spreader or other substrate of the thermal management device from which the thermal feature projects.

In some embodiments, the heat spreader or other substrate of the thermal management device from which the thermal feature projects is supported in the immersion bath substantially parallel to a direction of gravity. In such embodiments, a thermal feature and/or hollow bore with a longitudinal axis that is oriented at a non-perpendicular angle to a spreader surface causes a component of the buoyancy force of the vapor bubble(s) to urge the vapor bubble in the direction of the longitudinal axis and out of the hollow bore. The exit of the vapor bubble from the hollow bore produces an inflow of liquid working fluid to replace the vacated volume in the hollow bore, further producing turbulence in the working fluid to overcome adhesion forces and remove vapor bubbles from the surface of the thermal feature, delaying CHF.

In some embodiments, the thermal feature and the hollow bore have a longitudinal axis that is oriented at a perpendicular angle to a spreader surface of the heat spreader or other substrate of the thermal management device from which the thermal feature projects. However, the thermal management device and the hollow bore therein both flare in a transverse direction perpendicular to the longitudinal axis. The outer surface and the inner surface are each oriented at a non-parallel orientation with the longitudinal axis.

In some embodiments, the heat spreader or other substrate of the thermal management device from which the thermal feature projects is supported in the immersion bath substantially parallel to a direction of gravity. In such embodiments, a thermal feature and/or hollow bore with a longitudinal axis that is oriented at a non-perpendicular angle to a spreader surface causes a component of the buoyancy force of the vapor bubble(s) to urge the vapor bubble in the direction of the longitudinal axis and out of the hollow bore. The exit of the vapor bubble from the hollow bore produces an inflow of liquid working fluid to replace the vacated volume in the hollow bore, further producing turbulence in the working fluid to overcome adhesion forces and remove vapor bubbles from the surface of the thermal feature, delaying CHF.

In some embodiments, a thermal feature includes a cap affixed or integrally formed with a terminal end of the thermal feature distal from the heat spreader or substrate of the thermal management device. The cap further increases the surface area and contact area of the thermal feature. In some embodiments, the cap increases the surface area for applications with limited space between computing devices in the immersion bath, while the increased surface area distal from the heat spreader allows the cap to contact cooler liquid working fluid away from the heat spreader.

In some embodiments, the thermal feature has a cap with a greater outside diameter than that of the body positioned at a terminal end of the thermal feature. The cap increases the surface area and contact area of the thermal feature. In some embodiments, the cap is integrally formed with the body of the thermal feature. For example, the cap and body may be formed in a single continuous piece of material, such as via additive manufacturing, casting, forging, sintering, or other forming of a piece of material without interfaces between discrete parts.

In some embodiments, the cap is an annular or other shaped structure that is affixed, adhered, welded, or otherwise connected to the body. The cap includes an opening therethrough that allows fluid communication through the cap to the hollow bore of the thermal feature. The fluid communication through opening allows vapor bubbles to exit the hollow bore and allow inflow of liquid working fluid to replace the volume of the vapor bubble.

In some examples, a thickness of the body may be substantially constant in the longitudinal direction. In some examples, a thickness of the body may be substantially constant in the rotational direction around the longitudinal axis of the thermal feature. In some embodiments, however, a thickness of a body (e.g., between the inner surface and the outer surface) may change in or more directions. For example, a thickness of the body may change in the longitudinal direction. In some examples, a thickness of the body may change in the rotational direction around the longitudinal axis of the thermal feature.

In some embodiments, a thermal feature has a body thickness of a body that tapers in the distal direction away from the heat spreader or other substrate from which the thermal feature projects. In some embodiments, the outer surface of the body is substantially parallel to the longitudinal axis while the inner surface increases in inner diameter relative to the longitudinal axis in the distal direction. In some embodiments, the body thickness tapers in the distal longitudinal direction while the outer diameter of the body decreases or increases relative to the longitudinal axis.

In some embodiments, the tapering body allows the buoyancy force of the vapor bubbles to have at least a component of the buoyancy force that urges the vapor bubble from the hollow bore. The vapor bubble may then exit the hollow bore and allow inflow of liquid working fluid into the bore to replace the volume vacated by the vapor bubble.

In other embodiments, the body thickness increases in the distal direction. In some embodiments, a thermal feature has a substantially constant inner diameter of the inner surface of the hollow bore, while an outer diameter of an outer surface increases in the distal direction relative to a longitudinal axis. In some embodiments, the constant inner diameter allows the exit of vapor bubbles and inflow of liquid working fluid while the sloped outer surface allows the buoyancy force of the vapor bubbles to have at least a component of the buoyancy force that urges the vapor bubble longitudinally on the outer surface.

In some embodiments, the inner surface of the body is substantially parallel to the longitudinal axis while the outer surface increases in outer diameter relative to the longitudinal axis in the distal direction. In some embodiments, the body thickness increases in the distal longitudinal direction while the inner diameter of the inner surface decreases or increases relative to the longitudinal axis.

In some embodiments, a cap affixed to the distal end of the body has a beveled proximal edge. In some embodiments, a beveled or curved proximal edge and/or distal edge may allow for more efficiently flow of vapor bubbles and/or liquid working fluid around the distal end of the thermal feature, improving the release of vapor bubbles from the surfaces of the thermal feature.

It should be understood that a thermal management device according to the present disclosure may include a plurality of thermal features in an array. The array may include a plurality of similar or identical thermal features, such as any embodiments described herein, or a combination of different thermal features, such as a combination of any of the embodiments of thermal features described herein.

In some embodiments, the heat spreader or other substrate has a substrate thickness in a range having an upper value, a lower value, or upper and lower values including any of 0.5 millimeters (mm), 0.75 mm, 1.0 mm, 1.25 mm, 1.50 mm, 1.75 mm, 2.0 mm, or any values therebetween. For example, the substrate thickness may be greater than 0.5 mm. In some examples, the substrate thickness may be less than 2.0 mm. In some examples, the substrate thickness may be between 0.5 mm and 2.0 mm. In some examples, the substrate thickness may be between 1.0 mm and 1.75 mm. In some examples, the substrate thickness may be between 1.25 mm and 1.50 mm. In at least one example, the substrate thickness is approximately 1.4 mm.

In some embodiments, the thermal feature has a maximum outer body diameter in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the maximum outer body diameter may be greater or smaller than 0.5 mm. In some examples, the maximum outer body diameter may be less than 2.0 mm. In some examples, the maximum outer body diameter may be between 0.5 mm and 2.0 mm. In some examples, the maximum outer body diameter may be between 0.75 mm and 1.25 mm. In at least one example, the maximum outer body diameter is approximately 0.8 mm.

In some embodiments, the thermal feature has a cap height in a longitudinal direction in a range having an upper value, a lower value, or upper and lower values including any of 0.05 mm, 0.075 mm, 0.10 mm, 0.125 mm, 0.15 mm, 0.175 mm, 0.20 mm, or any values therebetween. For example, the cap height may be greater than 0.05 mm. In some examples, the cap height may be less than 0.20 mm. In some examples, the cap height may be between 0.05 mm and 0.20 mm. In some examples, the cap height may be between 0.075 mm and 0.125 mm. In at least one example, the cap height is approximately 0.1 mm.

In some embodiments, the thermal feature has a height in a longitudinal direction in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the height may be greater than 0.5 mm. In some examples, the height may be less than 2.0 mm. In some examples, the height may be between 0.5 mm and 2.0 mm. In some examples, the height may be between 0.75 mm and 1.25 mm. In at least one example, the height is approximately 1.1 mm.

The array may arrange the thermal features in a uniform pattern or a non-uniform pattern. In some embodiments, the thermal features are arranged in a repeating hexagonal close-pack array. In some embodiments, the thermal features are arranged in a repeating square array. In some embodiments, the thermal features are arranged in an irregular, non-repeating array.

The thermal features may be spaced apart at a constant spacing based on the relative locations of the longitudinal axis of each thermal feature. In some embodiments, the spacing is in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the spacing may be greater than 0.5 mm. In some examples, the spacing may be less than 2.0 mm. In some examples, the spacing may be between 0.5 mm and 2.0 mm. In some examples, the spacing may be between 0.75 mm and 1.25 mm. In at least one example, the spacing is approximately 1.0 mm.

In some embodiments, the thermal feature has an inner diameter in a transverse direction in a range having an upper value, a lower value, or upper and lower values including any of 0.2 mm, 0.3 mm, 0.4 mm, 0.5 mm, 0.6 mm, 0.7 mm, 0.8 mm, 0.9 mm, 1.0 mm, or any values therebetween. For example, the inner diameter may be greater than 0.2 mm. In some examples, the inner diameter may be less than 1.0 mm. In some examples, the inner diameter may be between 0.2 mm and 1.0 mm. In some examples, the inner diameter may be between 0.35 mm and 0.75 mm. In at least one example, the inner diameter is approximately 0.5 mm.

In some embodiments, the thermal feature has a cap outer diameter that is greater than a body outer diameter, and the cap outer diameter is in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the cap outer diameter may be greater than 0.5 mm. In some examples, the cap outer diameter may be less than 2.0 mm. In some examples, the cap outer diameter may be between 0.5 mm and 2.0 mm. In some examples, the cap outer diameter may be between 0.75 mm and 1.25 mm. In at least one example, the cap outer diameter is approximately 1.0 mm.

In some embodiments, the caps of adjacent thermal features contact one another. For example, contacting or connected caps may allow the caps to thermally conduct between the caps. In some embodiments, the caps of adjacent thermal features do not contact one another, allowing more clearance for fluid flow between caps and thermal features.

In some embodiments, a gap between a body of a first thermal feature of the array of thermal features and a body of a second thermal feature of the array of thermal features. In some embodiments, the gap is in a range having an upper value, a lower value, or upper and lower values including any of 0.2 mm, 0.3 mm, 0.4 mm, 0.5 mm, 0.75 mm, 1.0 mm, 1.25 mm, 1.50 mm, or any values therebetween. For example, the gap may be at least than 0.2 mm. In some examples, the gap may be no more than 1.5 mm. In some examples, the gap may be between 0.2 mm and 1.5 mm. In some examples, the gap may be between 0.4 mm and 1.0 mm. In at least one example, the gap is approximately 0.5 mm.

Various embodiments of thermal features have been described herein that expand the nucleate boiling regime for more efficient thermal transfer in immersion or liquid cooling systems. In some embodiments, the thermal feature includes a BEC and/or BESF to promote boiling and further expand the nucleate boiling regime. It should be understood that an embodiment of a thermal structure described herein may include a BEC or BESF on one or more surfaces thereof. For example, any of the embodiments describe herein may include a BEC or BESF.

In some embodiments, an array of thermal features has BESFs on an outer surface thereof and on an inner surface thereof. The BESFs provide nucleation sites on the thermal features that promote the formation and/or release of vapor bubbles. The nucleation sites promote boiling to reduce the onset temperature of the nucleate boiling regime. In some embodiments, BECs, such as those created by chemical vapor deposition, physical vapor deposition, electroplating, or other deposition techniques or BESFs, such as those created through deposition or subtractive methods such as ion etching, chemical etching, or other methods, create uneven surfaces that promote the formation and/or release of vapor bubbles to reduce the onset temperature of the nucleate boiling regime.

In some embodiments, the BECs and BESFs can be applied to or formed in the surface of solid thermal features, such as thermal features lacking a hollow bore. In some embodiments, a cap provides additional surface area distal from the spreader surface of the heat spreader or other substrate of the thermal management device. The cap can allow an increase in surface area and also promote the formation of vapor bubbles away from the spreader surface. A solid thermal feature, according to some embodiments of the present disclosure may have any dimensions of a body and/or cap described herein.

In some embodiments, the thermal feature has a maximum outer body diameter in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the maximum outer body diameter may be greater than 0.5 mm. In some examples, the maximum outer body diameter may be less than 2.0 mm. In some examples, the maximum outer body diameter may be between 0.5 mm and 2.0 mm. In some examples, the maximum outer body diameter may be between 0.75 mm and 1.25 mm. In at least one example, the maximum outer body diameter is approximately 0.8 mm.

In some embodiments, the thermal feature has a cap height in a longitudinal direction in a range having an upper value, a lower value, or upper and lower values including any of 0.05 mm, 0.075 mm, 0.10 mm, 0.125 mm, 0.15 mm, 0.175 mm, 0.20 mm, or any values therebetween. For example, the cap height may be greater than 0.05 mm. In some examples, the cap height may be less than 0.20 mm. In some examples, the cap height may be between 0.05 mm and 0.20 mm. In some examples, the cap height may be between 0.075 mm and 0.125 mm. In at least one example, the cap height is approximately 0.1 mm.

In some embodiments, the thermal feature has a height in a longitudinal direction in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the height may be greater than 0.5 mm. In some examples, the height may be less than 2.0 mm. In some examples, the height may be between 0.5 mm and 2.0 mm. In some examples, the height may be between 0.75 mm and 1.25 mm. In at least one example, the height is approximately 1.1 mm.

In some embodiments, the thermal features are spaced apart at a constant spacing based on the relative locations of the longitudinal axis of each thermal feature. In some embodiments, the spacing is in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the spacing may be greater than 0.5 mm. In some examples, the spacing may be less than 2.0 mm. In some examples, the spacing may be between 0.5 mm and 2.0 mm. In some examples, the spacing may be between 0.75 mm and 1.25 mm. In at least one example, the spacing is approximately 1.0 mm.

In some embodiments, the thermal feature has a cap outer diameter that is greater than a body outer diameter, and the cap outer diameter is in a range having an upper value, a lower value, or upper and lower values including any of 0.5 mm, 0.75 mm, 1.0 mm, 1.25 mm, 1.50 mm, 1.75 mm, 2.0 mm, or any values therebetween. For example, the cap outer diameter may be greater than 0.5 mm. In some examples, the cap outer diameter may be less than 2.0 mm. In some examples, the cap outer diameter may be between 0.5 mm and 2.0 mm. In some examples, the cap outer diameter may be between 0.75 mm and 1.25 mm. In at least one example, the cap outer diameter is approximately 1.0 mm.

Embodiments of thermal features have been described herein with a body having a cylindrical outer surface and a cylindrical inner surface. However, it should be understood that embodiments of thermal features according to the present disclosure may have other cross-sectional shapes than circle, and the shape of the outer surface may be different from that of an inner surface. In some embodiments, a body has an outer surface that is a different shape than an inner surface of the body proximate a bore. In some embodiments, the outer surface has a cross-sectional shape including any of a circle, an ellipse, other shape with at least partially curved portions, a triangle, a square, a rectangle, a pentagon, a hexagon, another regular polygon, irregular polygon, irregular shape, or combinations thereof. In some embodiments, the inner surface has a cross-sectional shape including any of a circle, an ellipse, other shape with at least partially curved portions, a triangle, a square, a rectangle, a pentagon, a hexagon, another regular polygon, irregular polygon, irregular shape, or combinations thereof.

In some embodiments, the cap has a different outer shape than the inner surface of the body. In some embodiments, the cap has a cross-sectional shape including any of a circle, an ellipse, other shape with at least partially curved portions, a triangle, a square, a rectangle, a pentagon, a hexagon, another regular polygon, irregular polygon, irregular shape, or combinations thereof.

In at least some embodiments according to the present disclosure, a thermal feature provides a surface area and/or surface features or coatings that expands the nucleate boiling regime to provide efficient thermal transfer in a two-phase immersion or liquid cooling system over a larger temperature range than a conventional heat spreader.

The present disclosure relates to systems and methods for cooling electronic components and/or devices according to at least the examples provided in the sections below:

[A1] In some embodiments, a thermal management device includes a substrate and a plurality of thermal features connected to a spreader surface of the substrate. At least one thermal feature of the plurality of thermal features includes a body having a longitudinal axis and a hollow bore in the body having inner diameter perpendicular to the longitudinal axis and an opening at a distal end distal from the substrate.

[A2] In some embodiments, the at least one thermal feature of [A1] includes a boiling enhancement coating on an inner surface of the body proximate the hollow bore.

[A3] In some embodiments, the at least one thermal feature of [A1] or [A2] includes a boiling enhancement coating on an outer surface of the body opposite the hollow bore.

[A4] In some embodiments, the at least one thermal feature of any of [A1] through [A3] includes a cap having a cap outer diameter greater than an outer body diameter and an opening therethrough to the hollow bore.

[A5] In some embodiments, the at least one thermal feature of [A4] includes a boiling enhancement coating on the cap.

[A6] In some embodiments, the cap outer diameter of [A4] or [A5] is at least 100% larger than an inner diameter of the hollow bore.

[A7] In some embodiments, the cap outer diameter of any of [A4] through [A6] is at least 50% larger than the outer body diameter.

[A8] In some embodiments, the cap of any of [A4] through [A7] has a cap height less than 20% of a height of the body.

[A9] In some embodiments, the cap of any of [A4] through [A8] has a beveled surface in a direction of the longitudinal axis.

[A10] In some embodiments, the cap of any of [A4] through [A9] is annular.

[A11] In some embodiments, the plurality of thermal features of any of [A1] through [A10] is arranged in a hexagonal close pack.

[A12] In some embodiments, the substrate of any of [A1] through [A11] includes a vapor chamber.

[A13] In some embodiments, the body of any of [A1] through [A12] has a transverse cross-section that is a circle.

[A14] In some embodiments, the body of any of [A1] through [A12] has a transverse cross-section that is a hexagon.

[A15] In some embodiments, an inner diameter of the body of any of [A1] through [A14] is at least 0.5 mm.

[A16] In some embodiments, the at least one thermal feature of any of [A1] through [A15] has a height of at least 1 mm.

[B1] In some embodiments, a thermal management device includes a heat spreader and a plurality of thermal features connected to a spreader surface of the heat spreader. At least one thermal feature of the plurality of thermal features includes a body having a longitudinal axis that is perpendicular to the spreader surface of the heat spreader, a hollow bore in the body having inner diameter perpendicular to the longitudinal axis, and a cap positioned at a terminal end of the body with an opening therethrough to provide fluid communication with the hollow bore.

[B2] In some embodiments, the thermal management device of [B1] further includes a gap of no less than 0.2 mm between a body of a first thermal feature of the plurality of thermal features and a body of a second thermal feature of the plurality of thermal features.

[B3] In some embodiments, the thermal management device of [B1] includes a gap of no more than 1.5 mm between a body of a first thermal feature of the plurality of thermal features and a body of a second thermal feature of the plurality of thermal features.

[C1] In some embodiments, a thermal management device includes a heat spreader and a plurality of thermal features connected to a spreader surface of the heat spreader. At least one thermal feature of the plurality of thermal features includes a body having a longitudinal axis that is perpendicular to the spreader surface of the heat spreader, a hollow bore in the body having inner diameter perpendicular to the longitudinal axis, a cap positioned at a terminal end of the body with an opening therethrough to provide fluid communication with the hollow bore, and at least one boiling enhancement coating or boiling enhancement surface feature positioned on at least one surface of the at least one thermal feature.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system comprising:
a thermal management device including:
a substrate having a spreader surface oriented parallel to the direction of gravity, and
a plurality of thermal features connected to the spreader surface of the substrate, wherein at least one thermal feature includes:
a body having a longitudinal axis, and
a hollow bore having an inner diameter perpendicular to the longitudinal axis and an opening at a distal end distal from the substrate; and
a liquid working fluid, wherein the at least one thermal feature is immersed in the liquid working fluid to create a pumping effect through the hollow bore by vaporization of the liquid working fluid in the hollow bore.

2. The thermal management system of claim 1, wherein the at least one thermal feature further comprises:
a boiling enhancement coating on an inner surface of the body proximate the hollow bore.

3. The thermal management system of claim 1, wherein the at least one thermal feature further comprises:
a boiling enhancement coating on an outer surface of the body opposite the hollow bore.

4. The thermal management system of claim 1, wherein the at least one thermal feature further comprises:
a cap having a cap outer diameter greater than an outer body diameter and an opening therethrough to the hollow bore.

5. The thermal management system of claim 4, wherein the at least one thermal feature further comprises:
a boiling enhancement coating on the cap.

6. The thermal management system of claim 4, wherein the cap outer diameter is at least 100% larger than an inner diameter of the hollow bore.

7. The thermal management system of claim 4, wherein the cap outer diameter is at least 50% larger than the outer body diameter.

8. The thermal management system of claim 4, wherein the cap has a cap height less than 20% of a height of the body.

9. The thermal management device of claim 4, wherein the cap has a beveled surface in a direction of the longitudinal axis.

10. The thermal management system of claim 4, wherein the cap is annular.

11. The thermal management system of claim 1, the plurality of thermal features arranged in a hexagonal close pack.

12. The thermal management system of claim 1, wherein the substrate includes a vapor chamber.

13. The thermal management system of claim 1, wherein the body has a transverse cross-section that is a circle.

14. The thermal management device of claim 1, wherein the body has a transverse cross-section that is a hexagon.

15. The thermal management system of claim 1, wherein an inner diameter of the body is at least 0.5 mm.

16. The thermal management system of claim 1, wherein the at least one thermal feature has a height of at least 1 mm.

17. The thermal management device of claim 1, wherein the substrate includes a heat spreader, wherein
the longitudinal axis is perpendicular to the spreader surface,
and further comprising
a cap positioned at a terminal end of the body, the cap having an opening therethrough to provide fluid communication with the hollow bore.

18. The thermal management device of claim 17, further comprising a gap of no less than 0.2 mm between a body of a first thermal feature of the plurality of thermal features and a body of a second thermal feature of the plurality of thermal features.

19. The thermal management device of claim 17, further comprising a gap of no more than 1.5 mm between a body of a first thermal feature of the plurality of thermal features and a body of a second thermal feature of the plurality of thermal features.

20. The thermal management device of claim 17 wherein the substrate includes a heat spreader, and further comprising at least one boiling enhancement coating or boiling enhancement surface feature positioned on at least one surface of the at least one thermal feature.

21. The thermal management system of claim 1, wherein the longitudinal axis is perpendicular to the spreader surface.

22. The thermal management system of claim 1, wherein the inner diameter of the bore is constant along the longitudinal axis.

\* \* \* \* \*